(12) United States Patent
Sherrer et al.

(10) Patent No.: US 6,759,173 B2
(45) Date of Patent: Jul. 6, 2004

(54) SINGLE MASK PROCESS FOR PATTERNING MICROCHIP HAVING GRAYSCALE AND MICROMACHINED FEATURES

(75) Inventors: David W. Sherrer, Blacksburg, VA (US); Mindaugas F. Dautartas, Blacksburg, VA (US)

(73) Assignee: Shipley Company, L.L.C., Marlborough, MA (US)

( * ) Notice: Subject to any disclaimer, the term of this patent is extended or adjusted under 35 U.S.C. 154(b) by 4 days.

(21) Appl. No.: 09/999,332

(22) Filed: Oct. 26, 2001

(65) Prior Publication Data

US 2003/0003382 A1 Jan. 2, 2003

Related U.S. Application Data

(60) Provisional application No. 60/243,445, filed on Oct. 26, 2000.

(51) Int. Cl.$^7$ .............................. G03F 9/00; G03C 5/00
(52) U.S. Cl. ......................... 430/22; 430/313; 430/315; 430/319
(58) Field of Search ......................... 430/22, 313, 315, 430/319

(56) References Cited

U.S. PATENT DOCUMENTS

| | | |
|---|---|---|
| 3,649,393 A | 3/1972 | Hatzakis |
| 5,310,623 A | 5/1994 | Gal .............................. 430/321 |
| 5,342,478 A | 8/1994 | Welbourn |
| 5,480,764 A | 1/1996 | Gal et al. .................... 430/321 |
| 6,071,652 A | 6/2000 | Feldman et al. ................ 430/5 |
| 6,107,000 A | 8/2000 | Lee et al. .................... 430/296 |

FOREIGN PATENT DOCUMENTS

EP            0 552 218 B1     4/1997

*Primary Examiner*—Christopher G. Young
(74) *Attorney, Agent, or Firm*—Jonathan D. Baskin

(57) ABSTRACT

A microchip is provided having a grayscale feature and a micromachined alignment feature registered to the grayscale feature. A process is also provided to ensure proper registration between the alignment feature and the grayscale feature by using a single exposure mask to define the grayscale feature and the alignment feature. In particular, the exposure mask includes a grayscale pattern representing the grayscale feature and an alignment pattern representing an alignment feature located at a specified position with respect to the grayscale pattern. The alignment pattern in the exposure mask marks the location of the micromachined feature in the microchip. Through a multistep deposition and etching process, the grayscale feature is formed within the substrate along with a micromachined alignment feature to enable the microchip to be mechanically aligned to other components of an optical system while maintaining proper registration of the grayscale feature.

44 Claims, 7 Drawing Sheets

SINGLE MASK PROCESS FOR PATTERNING MICROCHIP HAVING GRAYSCALE AND MICROMACHINED FEATURES

Applicants claim the benefit of priority of U.S. Provisional Application No. 60/243,445, filed on Oct. 26, 2000, the entire contents of which are incorporated herein by reference.

FIELD OF THE INVENTION

The present invention relates generally to a microchip comprising a grayscale feature and a micromachined alignment feature and a process for creating such a microchip, and more specifically to a process for creating the grayscale feature in registration with the micromachined alignment feature from a single exposure mask.

Background of the Invention

Microchips having optical structures, such as lenses or gratings, often need to be accurately aligned with other discrete components, such as optical fibers, lasers, and photodetectors, as well as additional microchips. The desired alignments can be accomplished passively by using micromachined alignment features on the microchip to register the microchip with the other selected components. However, registration of the microchip with the discrete components does not necessarily ensure proper optical alignment between the optical structures on the microchip and their counterparts on the registered components. In order to facilitate the registration of the optical structures on the microchip with the optical structures on the registered components, the optical structures on the microchip need to be accurately aligned relative to the micromachined surface features on the microchip.

Typically, many desired optical structures are not binary in nature but are instead fabricated using a grayscale exposure mask to create the desired surface profiles. In contrast, however, a binary mask is particularly suited to the creation of micromachined alignment features. Alignment surface features are most reliable when they have clear demarcations of sufficient depth to permit precise alignment between discrete components. Therefore, a need exists for a process for creating a microchip having optical features, such as those created by a grayscale mask, in addition to micromachined surface features, created by a binary mask. While separate exposure masks may often be used, i.e. one mask for the grayscale features and a second mask for the binary features, the use of two exposure masks introduces the potential for mis-registration between the alignment features and optical features, due to misalignment between the two separate exposure masks. Therefore, it would be beneficial to develop a method for creating alignment features and grayscale features on a microchip from a single exposure mask.

SUMMARY OF THE INVENTION

In accordance with the present invention, a process is provided for creating a grayscale feature and a micromachined alignment feature within a substrate from a single exposure mask. The exposure mask includes a grayscale pattern representing the desired grayscale feature and an alignment pattern for defining the location of one or more micromachined features relative to the position of the grayscale pattern. The use of a single exposure mask ensures that the grayscale features and the alignment features are accurately aligned with respect to one another.

The process of the present invention includes a step of providing a protective layer over a first surface of a substrate at the intended location of the alignment feature. An unprotected portion of the first surface of the substrate is provided at the intended location of the grayscale features. The unprotected portion may be formed by removing a section of the protective layer at the desired location to form the unprotected portion of the first surface of the substrate. A photosensitive mask layer is then deposited over the protective layer and the unprotected portion of the first surface of the substrate.

The photosensitive mask layer is exposed to light of a selected wavelength through a single exposure mask. The light exposure functions to develop a replica of the selected grayscale pattern within the photosensitive mask layer at the unprotected portion of the first surface. The light exposure also functions to develop a replica of the selected alignment pattern within the photosensitive mask layer at the protected portion of the first surface. The portion of the photosensitive mask layer containing the replica of the selected alignment pattern is completely removed to produce an alignment aperture through the photosensitive mask corresponding to the intended location of the micromachined feature. Defining the location of the micromachined feature relative to the position of the grayscale feature using the single exposure mask functions to precisely align such features in the substrate to provide an alignment feature.

Next, a portion of the protective layer is removed from at least a region within the alignment aperture to create an alignment cavity in the protective layer. The alignment cavity functions to precisely marks the location of a selected micromachined feature relative to the substrate. The grayscale pattern recorded in the photosensitive mask layer is then transferred into the substrate to create the desired grayscale feature in the substrate. This transfer process also functions to remove any remaining portions of the photosensitive mask layer from the protective layer of the substrate.

A feature-protection layer is then deposited over the grayscale feature and over the protective layer including the cavity in the protective layer. A barrier layer, such as a photoresist layer, is then patterned over the feature-protection layer over the substrate. An opening in the barrier layer is provided over the cavity in the protective layer for access to a portion of the feature-protection layer. The barrier layer functions to protect the portion of the feature-protection layer in the vicinity of the grayscale feature during further processing. The exposed portion of the feature-protection layer within the barrier layer opening is removed to expose the alignment cavity. The barrier layer is then removed.

The remaining portion of the protective layer located at the base of the alignment cavity is then removed to expose the first surface of the substrate located at the base of the cavity. The exposed portion of the substrate at the base of the alignment cavity is then selectively removed to create the desired micromachined feature.

In a particular application of the process, the protective layer over the first surface of the substrate may comprise two layers, a first inner layer comprising $SiO_2$ and a second outer layer comprising silicon nitride. In this configuration, the step of removing a portion of the protective layer to form the alignment cavity may comprise the step of substantially removing the outer silicon nitride layer to expose the inner layer at the base of the alignment cavity.

In addition, the step of creating a micromachined feature may include the step of anisotropic etching, which is particularly useful for creating micromachined features having sloped sidewalls, such as a V-shaped groove or pit. In this regard, the substrate material is chosen to have the proper crystal orientation for use with anisotropic etching to produce sloped sidewalls.

The invention also provides a microchip fabricated by the above process. The microchip comprises a substrate and a grayscale feature formed within a first surface of the substrate. A protective layer is disposed over the substrate. The protective layer includes an alignment feature aperture disposed at a selected positioned relative the grayscale feature. The microchip comprises an alignment feature disposed within the alignment feature aperture. The grayscale feature may comprise a refractive optical element or diffractive optical element. In particular the grayscale feature may comprise a lenslet array. The alignment feature may include a micromachined feature, such as a V-groove or pit. The microchip may optionally include a feature-protection layer disposed over the grayscale feature.

BRIEF DESCRIPTION OF THE DRAWINGS

The foregoing summary and the following detailed description of the preferred embodiments of the present invention will be best understood when read in conjunction with the appended drawings, in which.

DETAILED DESCRIPTION OF THE INVENTION

The present invention provides an optical microchip or substrate 12 having both a grayscale feature 30 representing an optical device and a micromachined feature 40 providing an alignment feature. The present invention also provides a process for fabricating such a microchip. Typical grayscale features include, for example, a refractive or diffractive optical element, such as a lenslet or lenslet array. Typical micromachined features include pits, cantilevers, and V-grooves. Proper alignment between the micromachined feature 40 and the grayscale feature 30 on the substrate 12 is ensured through the use of a single exposure mask, containing representations of both the grayscale and alignment features.

Figure 1A:
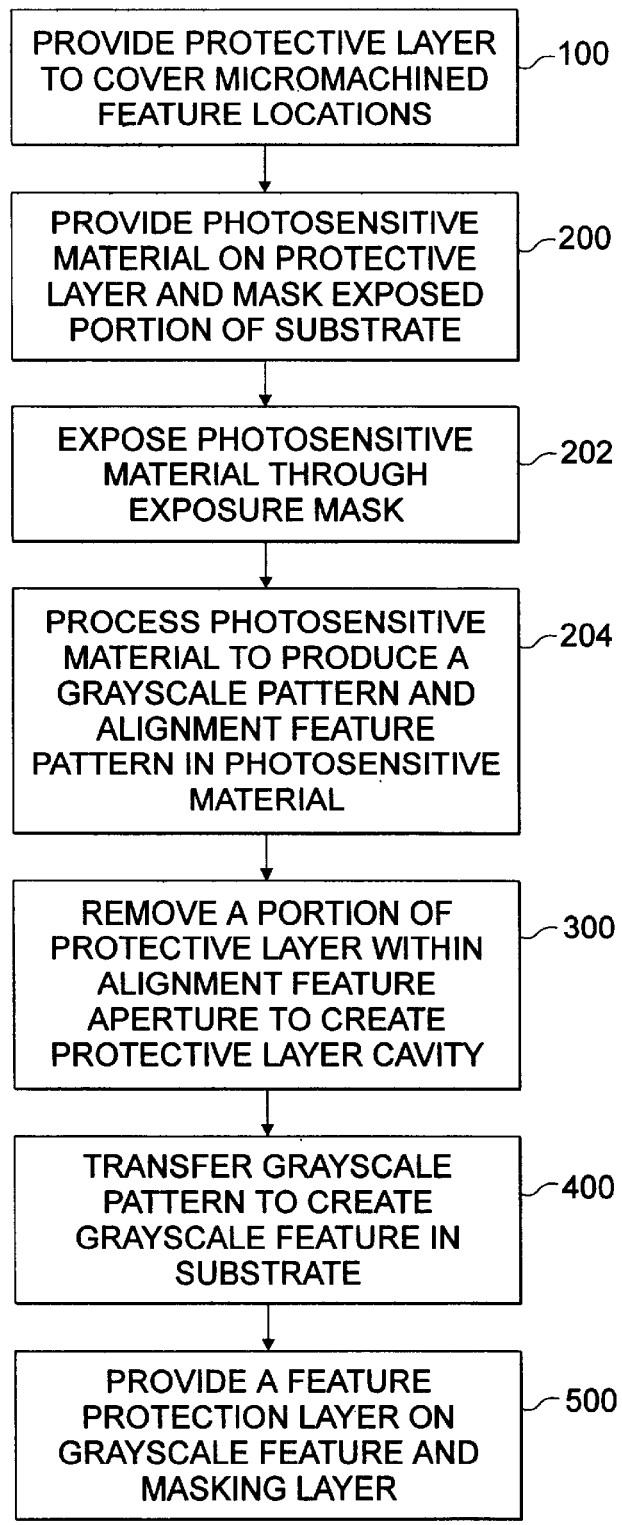
FIGS. 1A and 1B illustrate a flowchart representing the process of the present invention.
Figure 2:
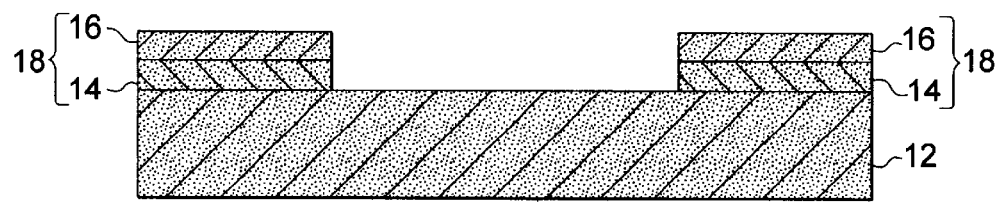
FIG. 2 schematically illustrates a cross-sectional view of a substrate having a protective layer in the form of a double protective layer disposed on the substrate at the intended location of micromachined features in the substrate.

With reference to the figures in which like elements are numbered alike, there is shown in FIG. 2 a substrate 12 patterned according to the first step, step 100, of the process of FIG. 1A. The substrate material is chosen with regard to the nature of the particular optical device and the micromachined feature 40 to be fabricated. Examples of materials that may be used in the substrate 12 include Si, GaAs, and InP. The crystal orientation of the substrate 12 may be chosen with respect to the desired orientation of the sidewalls of the micromachined feature 40. The selection of the crystal orientation is made in conjunction with the exposure mask orientation and the type of processing used, such as in the last step of the process, step 1000, to define the sidewall orientation of grooves or cavities to be formed in the substrate. For example, (100)-oriented Si may be selected to create a micromachined feature 40 having sidewalls that are sloped with respect to the top surface of the substrate 12. Alternatively, (110)-oriented Si may be selected to create a micromachined feature having sidewalls that are perpendicular to the top surface of the substrate 12.

As illustrated in FIG. 2, a substrate 12 made from Si is provided. The processing of the substrate 12 begins at step 100 of FIG. 1A by providing a protective layer 18 on a first surface of the substrate 12 to cover at least that portion of the substrate 12 in which the micromachined feature 40 is to be located. The areas on the first surface of the substrate 12 at which the grayscale feature 20 is located are not covered by the protective layer 18.

In application, the protective layer 18 may be deposited over the entire surface of the substrate 12. Thereafter, portions of the protective layer 18 may be removed to expose the first surface of the substrate 12 at the selected areas for the grayscale features 30. The protective layer 18 may be deposited onto the substrate 12 as a single layer, as shown in FIG. 1A. Alternatively, protective layer 18 may comprise separate layers to facilitate further processing of the chip, as shown in FIG. 2. As such, a first protective layer 14 can be deposited onto the substrate 12 formed of a material such as $SiO_2$, and a second protective layer 16 can be deposited over the first protective layer 14 comprising a material such as silicon nitride. The materials of the protective layers 14, 16 are chosen so that they may be selectively removed during subsequent processing. SiN/SiO$_2$ represents one such pairing of the materials. A suitable thickness for each of the SiO$_2$ and the SiN layers may be on the order of 0.1–4 microns. As an alternative, the protective layer 18 may comprise a metal layer, such as Cr.

Figure 3:
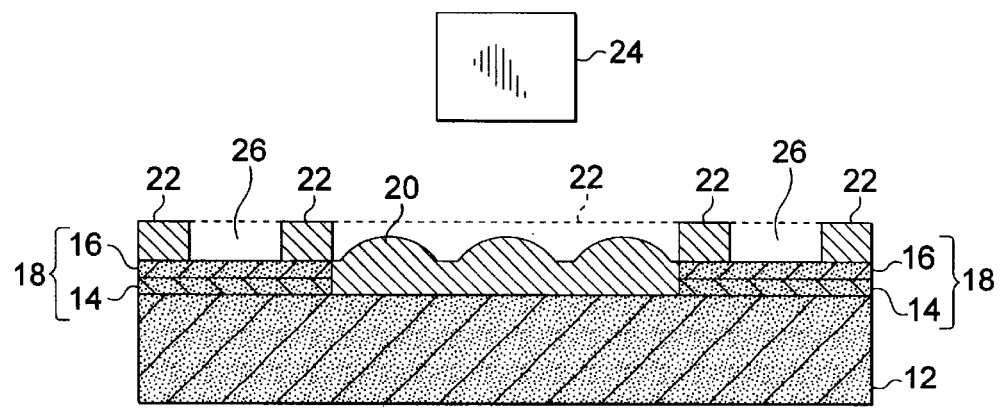
FIG. 3 schematically illustrates a cross-sectional view of the substrate of FIG. 2 but having a photosensitive mask layer having selected portions removed for defining a desired grayscale pattern and two alignment apertures for marking the location of two micromachined features.

Following the application of the protective layer 18, a photosensitive mask layer 22 is deposited, at step 200, over the protective layer 18 and the exposed portion of the substrate 12 not covered by the protective layer 18, as shown in FIG. 3. The photosensitive mask layer 22 is patterned by exposure, at step 202, to light through a single exposure mask 24. The photosensitive material is processed to replicate a selected grayscale pattern 20 and a selected pattern of alignment feature apertures 26 in the photosensitive mask layer 22.

The single exposure mask 24 includes a representation of the desired grayscale feature 30 and a representation of the alignment feature apertures 40 located at precise positions with respect to one another. The representation of the alignment feature apertures in the exposure mask 24 defines the intended location of the micromachined features 40. Inclusion of both the grayscale representation and the alignment feature representation on the same exposure mask 24 permits their transfer to the substrate 12 via a single exposure step, at step 202. The exposure mask 24 is oriented with respect to the substrate 12 so that the alignment features in the exposure mask 24 are in proper registration at the corresponding positions of the protective layer portions 18 on the substrate 12. To aid in this registration, it is desirable that the protective layer portions 18 cover a greater area than that of the corresponding alignment features to provide a margin of error in registering the exposure mask 24. As illustrated in FIG. 3, the protective layer portions 18 are wider than the alignment feature apertures 26 to be formed in the photosensitive mask layer 22.

The alignment feature apertures 26 and grayscale pattern 20 may be created in the photosensitive mask layer 22 using lithographic processes. For example, the photosensitive mask layer 22 may comprise photoresist, which is exposed using light of a selected wavelength transmitted through the exposure mask 24 to replicate the grayscale and alignment features in the photosensitive mask layer 22, at step 202. Standard photoresist processing techniques may be used to selectively remove portions of the photoresist to create the alignment feature apertures 26 and the selected grayscale pattern 20, at step 204.

Figure 4:
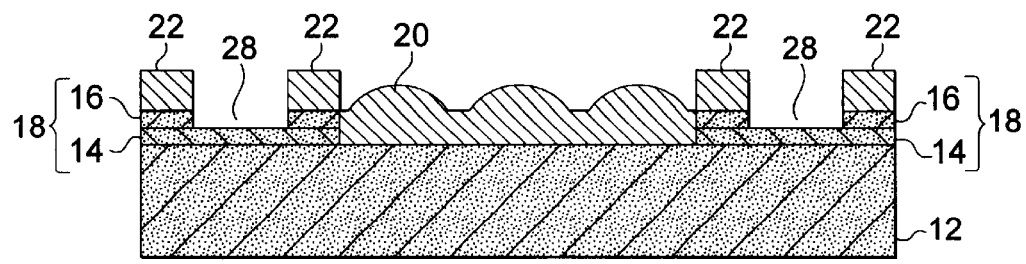
FIG. 4 schematically illustrates a cross-sectional view of the substrate of FIG. 3 but having one of the layers of the double protective layer removed at the intended location of the micromachined features in the substrate to create two alignment cavities in the protective layer.

Processing continues with the selective removal, at step 300, of a portion of the protective layer 18 located within the alignment feature apertures 26 to create alignment cavities 28 in the protective layer 18, as depicted in FIG. 4. The method of removal of the portion of the masking layer 18 is selected so that the photosensitive mask layer 22 is unaffected, thus maintaining the integrity of the grayscale pattern 20.

To increase control over the amount of material removed from the protective layer 18 when creating the alignment cavities 28, it may be desirable to create a two layered structure having first and second protective layers 14, 16. By choosing the materials for the first and second protective layers 14, 16 appropriately, the second protective layer 16 may be selectively removed at the location of the alignment feature apertures 26 without removing the first protective layer 14. The process of removal makes use of suitable methods, such as wet or dry etching. For example, reactive ion etching (RIE) using NF$_3$ may be employed for the selective removal of the second protective layer 16 in the case where such a layer comprises silicon nitride.

Figure 5:
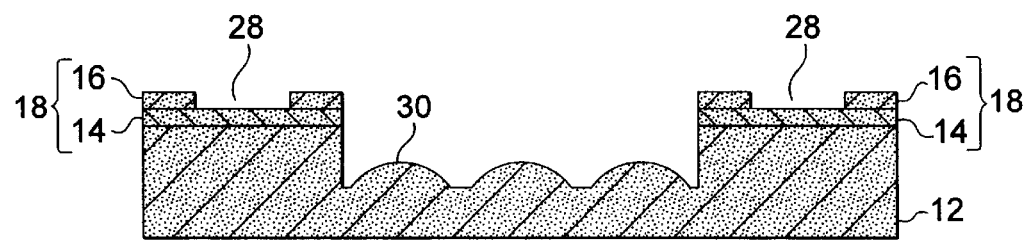
FIG. 5 schematically illustrates a cross-sectional view of the substrate of FIG. 4 wherein the grayscale pattern in the photosensitive mask has been transferred to the substrate and wherein the photosensitive mask has been removed from the areas of the protective layer.

Having transferred the alignment feature apertures 26 of the photosensitive mask layer 22 into the protective layer 18 in the form of alignment cavities 28, the remaining photosensitive material is selectively removed by a process that transfers, at step 400, the grayscale pattern 20 in the photosensitive layer 22 into the substrate 12 to create the desired grayscale feature 30 without affecting the protective layer 18, as shown in FIG. 5. An appropriate process for transferring the grayscale feature 30 into the substrate 12 includes reactive ion etching using SF$_6$ and O$_2$ or CF$_4$ and O$_2$.

Figure 6:
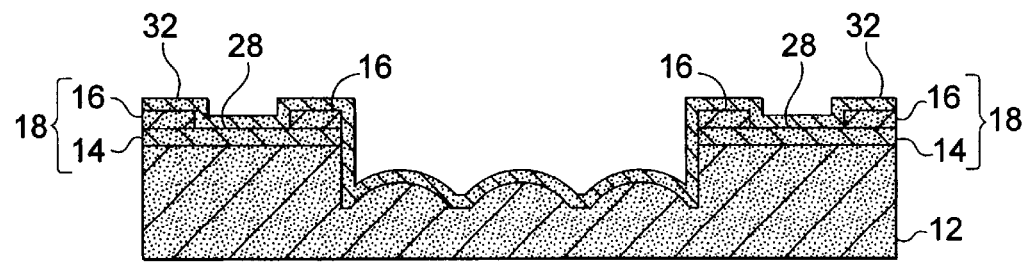
FIG. 6 schematically illustrates a cross-sectional view of the substrate of FIG. 5 wherein a feature-protection layer has been applied over top the grayscale feature and the protective layer.

In order to protect the grayscale feature 30 during subsequent processing steps, a feature-protection layer 32 is deposited, at step 500, on the grayscale feature 30 and on the exposed surfaces of the protective layer 18 including the alignment cavities 28, as shown in FIG. 6. The feature-protection layer 32 may be conformally deposited by chemical vapor deposition (CVD), for example. An appropriate choice for the feature-protection layer 32 includes a material that may be selectively removed or retained as desired. It may be desirable to retain the feature-protection layer 32 on the grayscale feature 30 in the final microchip to act as an antireflection coating. For example, a thin layer of silicon nitride, for example, 200 nm–500 nm thick, can serve as both an adequate protection coating and as an antireflection coating. The feature-protection layer 32 can also comprise a CVD oxide.

Figure 1B:
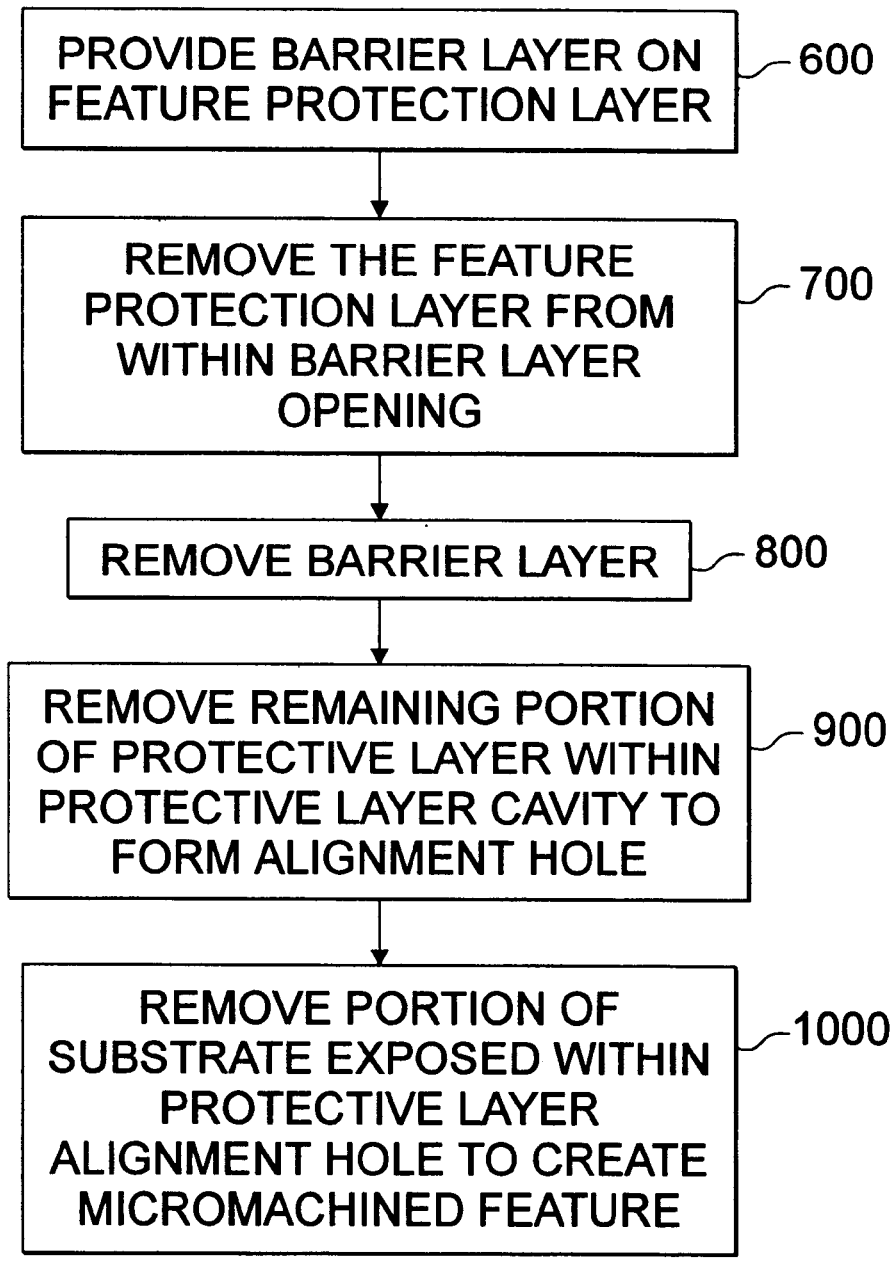
Figure 7:
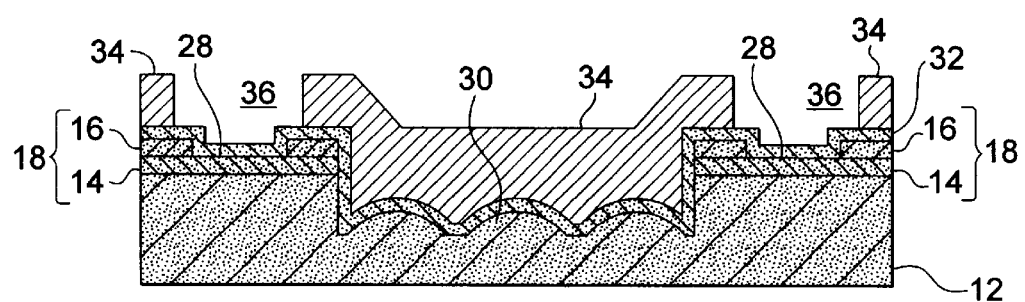
FIG. 7 schematically illustrates a cross-sectional view of the substrate of FIG. 6 wherein a barrier layer has been patterned over the top of the feature-protection layer and over portions of the protective layer but leaving openings in the barrier layer exposing the feature-protection layer in the vicinity of the alignment cavities.

With the feature-protection layer 32 in place, processing continues by applying, at step 600 of FIG. 1B, a barrier layer 34 having openings 36 on the feature-protection layer 32, as shown in FIG. 7. The openings 36 in the barrier layer 34 encompass the regions of the alignment cavities 28 in the protective layer 18, but do not extend into the region containing the grayscale feature 30. In particular, it is desirable that the openings 36 be wider than the alignment cavities 28, to provide greater tolerance with which the openings 36 in the barrier layer 34 can be aligned with the alignment cavities 28. A suitable material for the barrier layer 34 is photoresist, which may be processed to form the structure depicted in FIG. 7 in a manner similar to that described with respect to steps 200–204.

Figure 8:
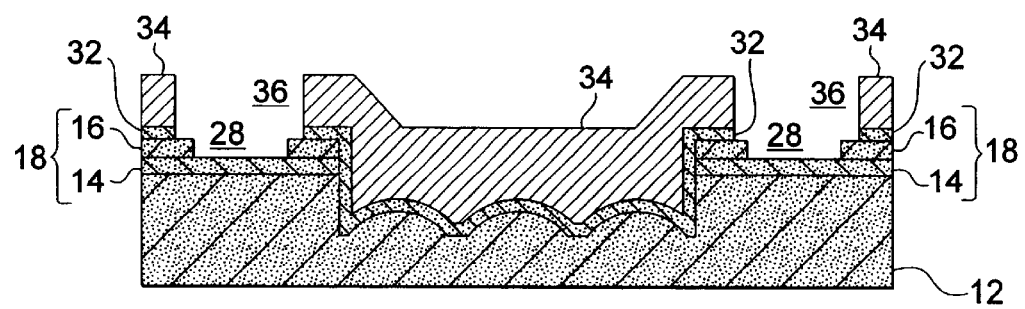
FIG. 8 schematically illustrates a cross-sectional view of the substrate of FIG. 7 wherein the feature-protection layer has been removed from within the barrier layer openings to expose the alignment cavities in the protective layer.

Next, as shown in FIG. 8, the portion of the feature-protection layer 32 covering the alignment cavities 28 and accessible through the openings 36 in the barrier layer 34 is selectively removed, at step 700, leaving the barrier layer 34 and the first and second protective layers 14, 16 contained within the openings 36 substantially intact, as shown in FIG. 8. An appropriate process for the removal of the portion of the feature-protection layer 32 is reactive ion etching, similar to that described with respect to step 300. Wet etching may also be used to remove the portion of the feature-protection layer 32.

Figure 9:
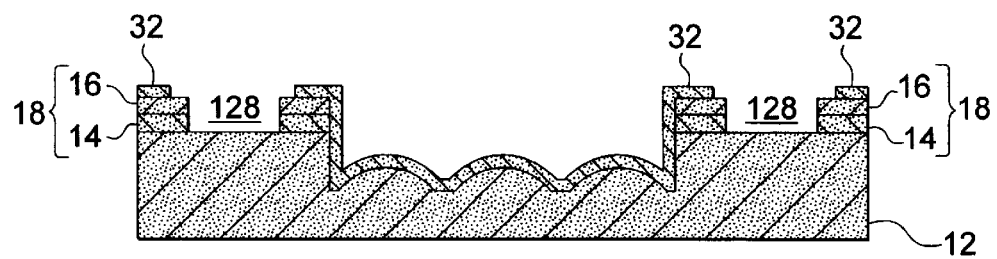
FIG. 9 schematically illustrates a cross-sectional view of the substrate of FIG. 8 wherein the barrier layer has been completely removed and the remaining layer of the protective layer has been removed from the base of the alignment cavities to expose the surface of the substrate at the base of the alignment cavities.

The remaining portions of the barrier layer 34 are then removed, at step 800, leaving the feature-protection layer 32 and the substrate 12 substantially intact. The first protective layer 14 within the alignment cavities 28 is then selectively removed, at step 900, to form alignment holes 128, as shown in FIG. 9. The removal of the first protective layer at the base of the alignment cavities 28 functions to expose the first surface of the substrate 12 at the base of the alignment holes 128. Dry or wet etching may be used to remove layer 14.

By revealing the surface of the substrate 12 at the base of the alignment holes 128, the desired locations of the micromachined features 40 in the substrate 12 is now accessible. The alignment holes 128 retain registration with respect to the grayscale feature 30, because the alignment holes 128 and the grayscale feature 30 at the surface of the substrate were defined by the same exposure step, step 202.

Figure 10:
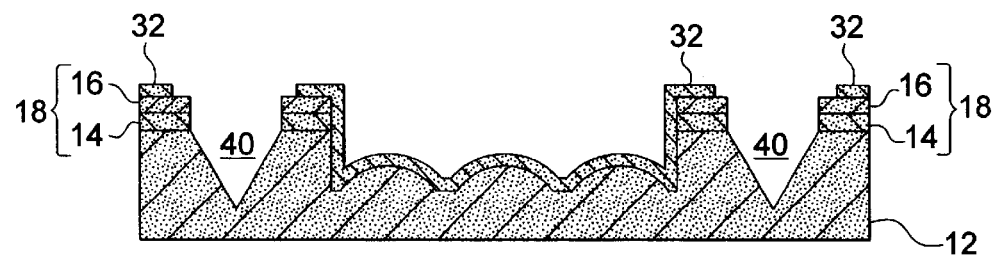
FIG. 10 schematically illustrates a cross-sectional view of the substrate of FIG. 9 wherein the micromachined features (having V-shaped cross-sections) have been created within the substrate.
Figure 11A:
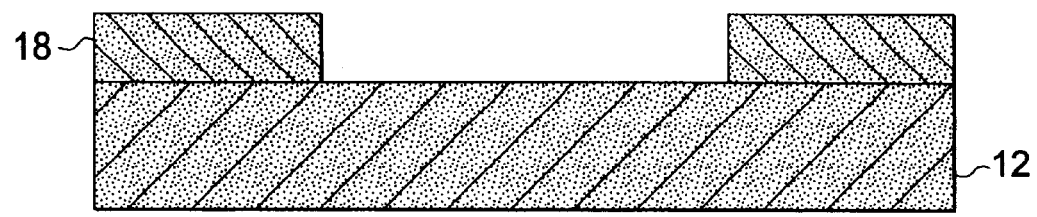
FIG. 11A schematically illustrates a cross-sectional view of a substrate having a protective layer in the form of a single protective layer disposed on the substrate at the intended location of micromachined features in the substrate.
Figure 11B:
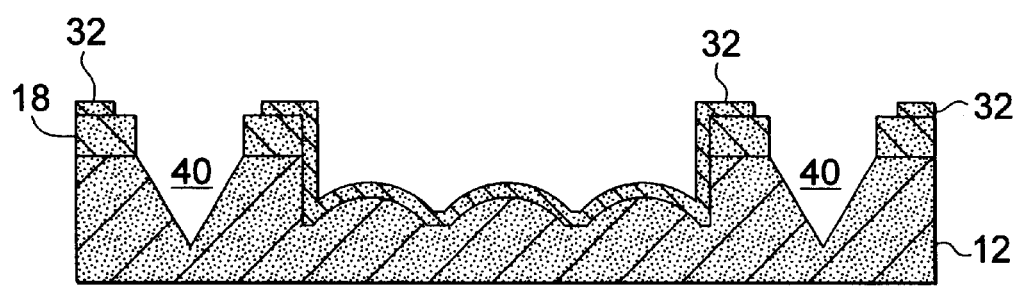
FIG. 11B schematically illustrates a cross-sectional view of a substrate similar to that shown in FIG. 10 except that the protective layer comprises a single layer.

The portion of the substrate 12 accessible through the alignment holes 128 is then removed, at step 1000, by a process selected to create micromachined alignment features 40 of the desired geometry. For example, wet anisotropic etching, such as etching by KOH, can be used to create micromachined features 40 in the form of V-shaped grooves or V-shaped pits in (100)-oriented Si, as shown in FIG. 10. Alternatively, wet or dry etching may be used to create micromachined features 40 having vertical sidewalls perpendicular to the surface of the substrate 12 in (110)-oriented Si. As a result of the process, a microchip having a grayscale feature 30 registered to micromachined alignment features 40 is created, as shown in FIG. 10. For the process variation where the protective layer 18 comprises a single layer, a microchip as illustrate in FIG. 11B is created.

These and other advantages of the present invention will be apparent to those skilled in the art from the foregoing specification. Accordingly, it will be recognized by those skilled in the art that changes or modifications may be made to the above-described embodiments without departing from the broad inventive concepts of the invention. For example, for the particular configuration illustrated herein, two micromachined features 40 are provided. However a different number of micromachined features 40 may be created in accordance with the process of the present invention. Likewise, the process of the present invention is equally well suited to the creation of a plurality of grayscale features. Furthermore, the steps involving the removal of layers or materials may be accomplished by appropriate choices of wet or dry, isotropic or anisotropic etching. The addition of various layers of material in the process may be accomplished by methods such as spin coating, chemical vapor deposition, or physical vapor deposition. It should therefore be understood that this invention is not limited to the particular embodiments described herein, but is intended to include all changes and modifications that are within the scope and spirit of the invention as set forth in the claims.

What is claimed is:

1. A process for creating in a substrate a grayscale feature and a micromachined alignment feature from a single exposure mask comprising:

providing a protective layer over a first surface of the substrate at a selected location of a substrate alignment feature;

providing a photosensitive material layer over the protective layer and over an exposed portion of the first substrate surface;

exposing the photosensitive material layer with light through an exposure mask having a grayscale pattern and an alignment pattern;

processing the photosensitive material layer to produce a replica of the grayscale pattern within the photosensitive material layer and to produce a micromachined feature aperture corresponding to the alignment pattern within the photosensitive material;

removing a portion of The protective layer within the micromachined feature aperture to create a protective layer cavity at the desired location of the micromachined feature;

transferring the grayscale pattern present in the photosensitive material layer to the substrate to create a grayscale feature in the substrate;

providing a feature-protection layer over the grayscale feature and the protective layer;

providing a barrier layer over the feature-protection layer with an opening overlapping the protective layer cavity;

removing a portion of the feature-protection layer Thorn within the opening;

removing the barrier layer;

removing the remaining portion of the protective layer within the protective layer cavity; and removing a portion of the substrate within the protective layer cavity to create the micromachined feature in the substrate.

2. The process according to claim 1 wherein the step of providing a protective layer comprises providing a first protective layer over the first substrate surface and a second protective layer over the first protective layer.

3. The process according to claim 2 wherein the step of removing a portion of the protective layer comprises the step of removing the second protective layer.

4. The process according to claim 2 wherein the first protective layer comprises $SiO_2$ and the second protective layer comprises silicon nitride.

5. The process according to claim 4 wherein the step of removing a portion of the protective layer comprises the step of removing the silicon nitride layer.

6. The process according to claim 1 wherein the step of exposing the photosensitive material layer comprises the step of orienting the exposure mask so that the alignment pattern of the exposure mask is in registration with the protective layer.

7. The process according to claim 1 wherein the step of removing a portion of the protective layer preserves the photosensitive material layer substantially intact.

8. The process according to claim 1 wherein the step of transferring the grayscale feature preserves the protective layer substantially intact.

9. The process according to claim 1 wherein the grayscale feature comprises one or more of a refractive optical element and a diffractive optical element.

10. The process according to claim 1 wherein the feature-protection layer comprises silicon nitride or $SiO_2$, or combinations thereof.

11. The process according to claim 1 wherein the micronrachined feature comprises a sloped sidewall.

12. The process according to claim 1 wherein the micromachined feature comprises a v-shaped groove or pit.

13. The process according to claim 1 wherein the micromachined feature comprises a sidewall perpendicular to the first surface of the substrate.

14. The process according to claim 1 wherein the barrier layer comprises photoresist.

15. The process according to claim 1 wherein the protective layer includes a metal.

16. A process for creating in a substrate a grayscale feature and an alignment feature from a single exposure mask comprising:

providing a protective layer over the substrate at selected locations so that positions of the substrate have a protective layer and other portions are exposed;

providing a photosensitive material layer over the portions having the protective layer and over the exposed portions;

providing an exposure mask for the photosensitive layer having a grayscale pattern and an alignment feature pattern;

creating the grayscale pattern from the exposure mask in the photosensitive layer over the exposed portion of the substrate;

creating the alignment feature pattern of the exposure mask in the photosensitive layer over the protective layer;

transferring the grayscale pattern of the photosensitive layer to the substrate to create a grayscale feature in the substrate;

transferring the alignment feature pattern of the photosensitive layer to the protective layer; and transferring the alignment feature pattern from the protective layer to the substrate.

17. The process according to claim 16 wherein the step of creating the grayscale pattern comprises the step of processing the photosensitive material layer to produce a replica of the grayscale pattern within the photosensitive material layer and to produce an alignment feature aperture corresponding to the alignment pattern within the photosensitive material.

18. The process according to claim 16 wherein the step of providing a protective layer comprises providing a first protective layer over the first substrate surface and a second protective layer over the first protective layer.

19. The process according to claim 18 wherein the step of removing a portion of the protective layer comprises the step of removing the second protective layer.

20. The process according to claim 18 wherein the first protective layer comprises $SiO_2$ and the second protective layer comprises silicon nitride.

21. The process according to claim 20 wherein the step of transferring the alignment feature pattern to the protective layer comprises removing at least a portion of the protective layer at the location of the alignment feature pattern in the photosensitive layer.

22. The process according to claim 21 wherein the step of transferring the alignment feature pattern to the protective layer includes removing the entire protective layer at the location of the alignment feature pattern in the photosensitive layer to expose the substrate.

23. The process according to claim 22 wherein the step of transferring the alignment feature pattern to the substrate includes forming the alignment feature in the exposed substrate.

24. The process according to claim 21 wherein the step of removing a portion of the protective layer preserves the photosensitive material layer substantially intact.

25. The process according to claim 21 including the step of providing a feature-protection layer over the grayscale feature in the substrate and over the protective layer having the portion removed.

26. The process according to claim 25 including selectively removing a portion of the feature-protection layer coveting the portion of the protective layer having a portion removed.

27. The process according to claim 16 wherein the step of transferring the grayscale feature preserves the protective layer substantially intact.

28. The process according to claim 16 wherein the grayscale feature comprises one or more of a refractive optical element and a diffractive optical element.

29. The process according to claim 16 including the step of providing a feature-protection layer over the grayscale feature in the substrate.

30. The process according to claim 29 wherein the feature-protection layer comprises silicon nitride.

31. The process according to claim 16 wherein the step of transferring the alignment feature to the substrate includes the step of removing a portion of the substrate.

32. A process for creating in a substrate a grayscale feature and an alignment feature from a single pattern mask comprising: providing a protective layer over the substrate at selected locations so that portions of the substrate have a protective layer and other portions are exposed;

providing a patternable material layer over the portions having the protective layer and over the exposed portions;

providing a mask for the patternable layer having a grayscale pattern and an alignment feature pattern;

creating the grayscale pattern from the mask in the patternable layer over the exposed portion of the substrate;

creating the alignment feature pattern of the mask in the patternable layer aver the protective layer;

transferring the grayscale pattern of the patternable layer to the substrate to create a grayscale feature in the substrate;

transferring the alignment feature pattern of the patternable layer to the protective layer; and transferring the alignment feature pattern from the protective layer to the substrate to create an alignment feature in the substrate.

33. The process according to claim 32 wherein the grayscale feature comprises one or more of a refractive optical element and a diffractive optical element.

34. The process according to claim 32 wherein die grayscale feature comprises lenslet array.

35. The process according to claim 32 wherein the step of creating the grayscale pattern comprises the step of processing the patternable layer to produce a replica of the grayscale pattern within the patternable layer and to produce an alignment feature aperture corresponding to the alignment pattern within the patternable layer.

36. The process according to claim 32 wherein the step of providing a protective layer comprises providing a first protective layer over the first substrate surface and a second protective layer over the first protective layer.

37. The process according to claim 36 wherein the step of removing a portion of the protective layer comprises the step of removing the second protective layer.

38. The process according to claim 36 wherein the first protective layer comprises $SiO_2$ and the second protective layer comprises silicon nitride.

39. The process according to claim 32 wherein the step of transferring the alignment feature pattern to the protective layer comprises removing at least a portion of the protective layer at the location of the alignment feature pattern in the patternable layer.

40. The process according to claim 32 wherein the step of transferring the alignment feature pattern to the protective layer includes removing the entire protective layer at the location of the alignment feature pattern in the patternable layer to expose the substrate.

41. The process according to claim 40 wherein the step of transferring the alignment feature pattern to the substrate includes forming the alignment feature in The exposed substrate.

42. The process according to claim 41 including the step of providing a feature-protection layer over the grayscale feature in the substrate and over the protective layer having the portion removed.

43. The process according to claim 32 wherein the step of transferring the alignment feature to the substrate includes the step of removing a portion of the substrate.

44. A process for creating in a substrate a grayscale feature and a micromachined alignment feature from a single exposure mask comprising:

providing a protective layer over a first surface of the substrate;

providing a photosensitive material layer over the protective layer;

exposing the photosensitive material layer with light through an exposure mask having a grayscale pattern and an alignment pattern;

processing the photosensitive material layer to produce a replica of the grayscale pattern within the photosensitive material layer and to produce a micromachined feature aperture corresponding to the alignment pattern within the photosensitive material;

removing a portion of the protective layer within the micromachined feature aperture to create a protective layer cavity at the desired location of the micromachined feature;

transferring the grayscale pattern present in the photosensitive material layer to the substrate to create a grayscale feature in the substrate;

providing a feature-protection layer over the grayscale feature and the protective layer;

providing a barrier layer over the feature-protection layer with an opening overlapping the protective layer cavity;

removing a portion of the feature-protection layer from within the opening;

removing the barrier layer;

removing the remaining portion of the protective layer within the protective layer cavity; and removing a portion of the substrate within the protective layer cavity to create the micromachined feature in the substrate.

* * * * *